(12) United States Patent
Gorman

(10) Patent No.: US 9,825,447 B1
(45) Date of Patent: Nov. 21, 2017

(54) ELECTRICAL JUNCTION BOX

(71) Applicant: William Gorman, Pahrump, NV (US)

(72) Inventor: William Gorman, Pahrump, NV (US)

( * ) Notice: Subject to any disclaimer, the term of this patent is extended or adjusted under 35 U.S.C. 154(b) by 0 days.

(21) Appl. No.: 15/331,108

(22) Filed: Oct. 21, 2016

(51) Int. Cl.
| | |
|---|---|
| H02G 3/18 | (2006.01) |
| H01R 13/635 | (2006.01) |
| H01R 24/78 | (2011.01) |
| H02G 3/10 | (2006.01) |
| H02G 5/06 | (2006.01) |
| H02K 5/04 | (2006.01) |
| H01R 13/02 | (2006.01) |
| H01R 13/639 | (2006.01) |
| H01R 13/652 | (2006.01) |
| H05K 5/04 | (2006.01) |
| H02G 3/08 | (2006.01) |
| H01R 103/00 | (2006.01) |

(52) U.S. Cl.
CPC ............ *H02G 3/18* (2013.01); *H01R 13/025* (2013.01); *H01R 13/635* (2013.01); *H01R 13/6395* (2013.01); *H01R 13/652* (2013.01); *H01R 24/78* (2013.01); *H02G 3/081* (2013.01); *H02G 3/10* (2013.01); *H02G 5/06* (2013.01); *H05K 5/04* (2013.01); *H01R 2103/00* (2013.01)

(58) Field of Classification Search
USPC .......................................................... 174/53
See application file for complete search history.

(56) References Cited

U.S. PATENT DOCUMENTS

| | | | | |
|---|---|---|---|---|
| 3,040,926 A | * | 6/1962 | Palmer .................. | H02G 3/126 174/58 |
| 3,510,822 A | * | 5/1970 | Patterson ................ | H01R 4/36 174/51 |
| 3,676,571 A | * | 7/1972 | Rubinstein ........... | H02G 3/0683 174/663 |
| 3,716,651 A | * | 2/1973 | Werner ................ | H01R 25/006 174/53 |
| 4,165,443 A | * | 8/1979 | Figart .................... | H02G 3/086 174/53 |
| 5,415,564 A | * | 5/1995 | Winter .................. | H01R 24/76 439/535 |
| 5,471,012 A | * | 11/1995 | Opel ........................ | H02G 3/16 174/53 |
| 5,595,491 A | * | 1/1997 | May ...................... | H01R 24/76 439/106 |
| 5,723,817 A | * | 3/1998 | Arenas .................... | H02G 3/14 174/66 |
| 5,936,200 A | * | 8/1999 | Park ........................ | H01R 4/26 174/59 |

(Continued)

*Primary Examiner* — Michael F McAllister

(57) ABSTRACT

An electrical junction box includes a housing that defines an internal space. The housing has a front, which is open. A buss bar is coupled to the housing and is positioned in the internal space. A plurality of connectors is coupled to the buss bar and extends through a respective opposing side of the housing. A plurality of couplers is coupled to the buss bar. The couplers are positioned on a front face of the buss bar. The connectors are configured for insertion of wires, such that the wires are coupled to the buss bar and the buss bar is coupled to an electrical circuit. The couplers are configured for insertion of wiring that is coupled to an electrical device, such as a switch, light, fan or outlet. The wiring is coupled to the buss bar and the electrical device is coupled to the electrical circuit.

16 Claims, 3 Drawing Sheets

(56) References Cited

U.S. PATENT DOCUMENTS

| | | | |
|---|---|---|---|
| D422,266 S | 4/2000 | Roesch | |
| 6,156,971 A * | 12/2000 | May | H01R 24/76 |
| | | | 174/59 |
| 6,191,361 B1 | 2/2001 | Matty | |
| 6,201,187 B1 * | 3/2001 | Burbine | H01R 13/465 |
| | | | 174/53 |
| 6,435,903 B1 * | 8/2002 | Nelson | H01R 13/71 |
| | | | 174/57 |
| 6,576,835 B1 | 6/2003 | Ford et al. | |
| 6,617,511 B2 * | 9/2003 | Schultz | H01R 24/70 |
| | | | 174/50 |
| 6,786,766 B1 * | 9/2004 | Chopra | H01R 4/4827 |
| | | | 439/441 |
| 7,090,530 B1 | 8/2006 | Dibble | |
| 7,294,017 B2 | 11/2007 | Scott | |
| 7,294,917 B2 | 11/2007 | Matsushita | |
| 7,614,922 B1 | 11/2009 | Buse | |
| 7,709,753 B1 * | 5/2010 | Russo | H01R 9/2458 |
| | | | 174/135 |
| 7,767,905 B2 | 8/2010 | Meyer | |
| 7,851,704 B2 * | 12/2010 | Fitch | H02G 3/00 |
| | | | 174/50 |
| 2006/0216988 A1 * | 9/2006 | Scott | H01R 9/2433 |
| | | | 439/535 |
| 2009/0107693 A1 * | 4/2009 | Meyer | H02G 3/123 |
| | | | 174/60 |

* cited by examiner

ELECTRICAL JUNCTION BOX

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIE THE OFFICE ELECTRONIC FILING SYSTEM

Not Applicable

STATEMENT REGARDING PRIOR DISCLOSURES BY THE INVENTOR OR JOINT INVENTOR

Not Applicable

BACKGROUND OF THE INVENTION (1) Field of the Invention (2) Description of Related Art Including Information Disclosed Under 37 CFR 1.97 and 1.98

The disclosure and prior art relates to electrical junction boxes and more particularly pertains to a new electrical junction box for safe and rapid connection of devices to an electrical circuit.

BRIEF SUMMARY OF THE INVENTION

An embodiment of the disclosure meets the needs presented above by generally comprising a housing that defines an internal space. The housing has a front, which is open. A buss bar is coupled to the housing and is positioned in the internal space. A plurality of connectors is coupled to the buss bar and extends through a respective opposing side of the housing. A plurality of couplers is coupled to the buss bar. The couplers are positioned on a front face of the buss bar. The connectors are configured for insertion of wires, such that the wires are coupled to the buss bar and the buss bar is coupled to an electrical circuit. The couplers are configured for insertion of wiring that is coupled to an electrical device, such as a switch, light, fan or outlet. The wiring is coupled to the buss bar and the electrical device is coupled to the electrical circuit.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF SEVERAL VIEWS OF THE DRAWING(S)

The disclosure will be better understood and objects other than those set forth above will become apparent when consideration is given to the following detailed description thereof. Such description makes reference to the annexed drawings wherein.

DETAILED DESCRIPTION OF THE INVENTION

Figure 1:
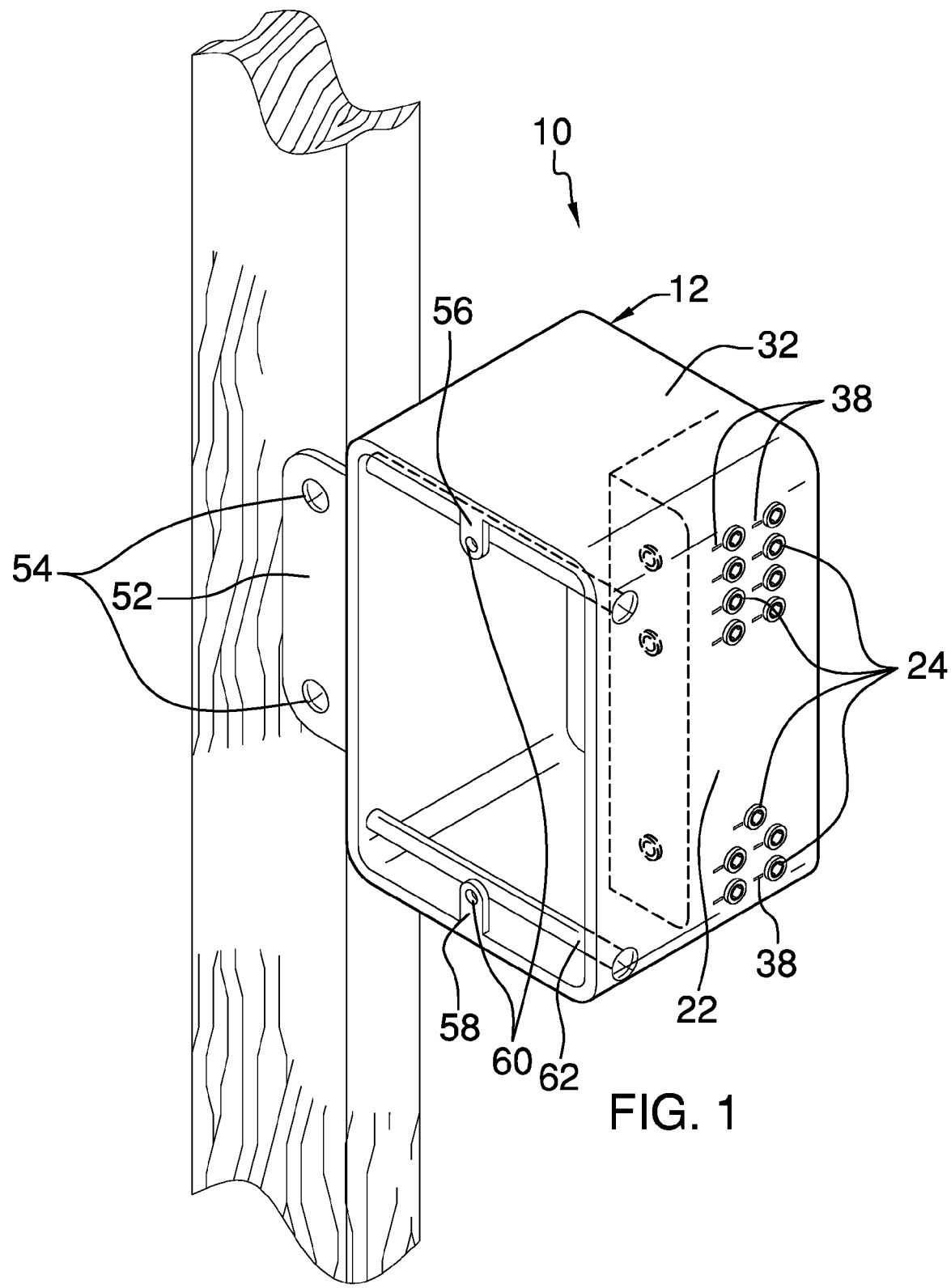
FIG. 1 is an isometric perspective view of an electrical junction box according to an embodiment of the disclosure.
Figure 2:
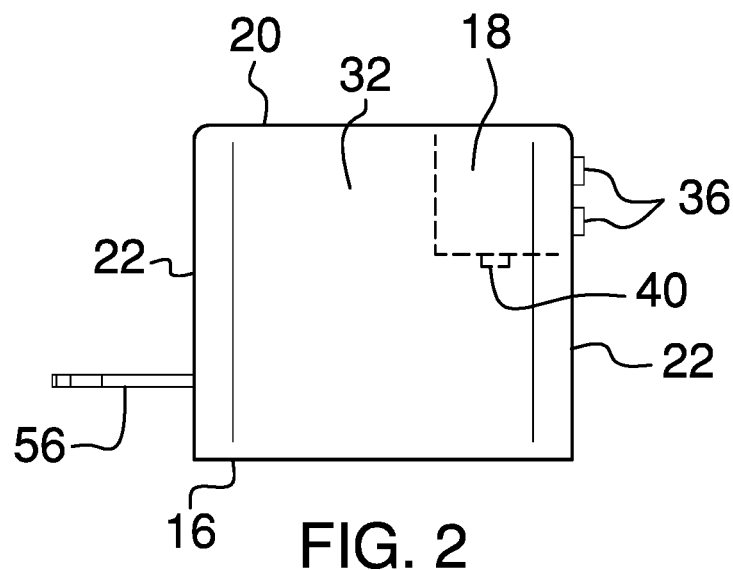
FIG. 2 is a top view of an embodiment of the disclosure.
Figure 3:
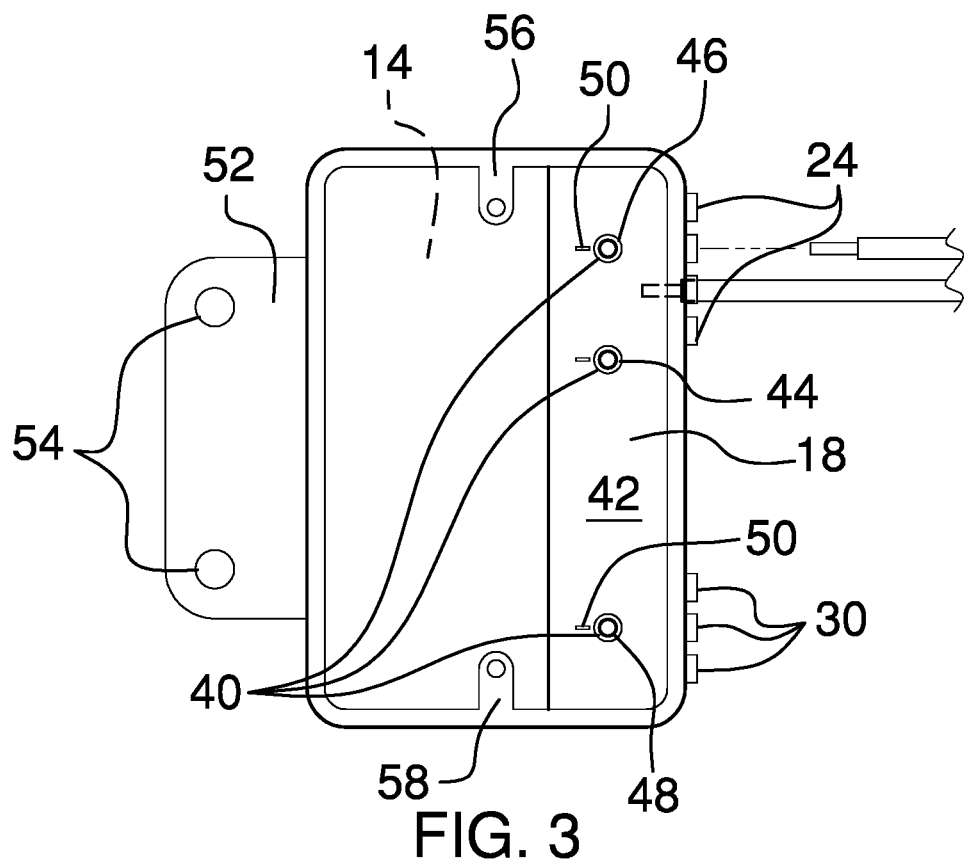
FIG. 3 is a front view of an embodiment of the disclosure.
Figure 4:
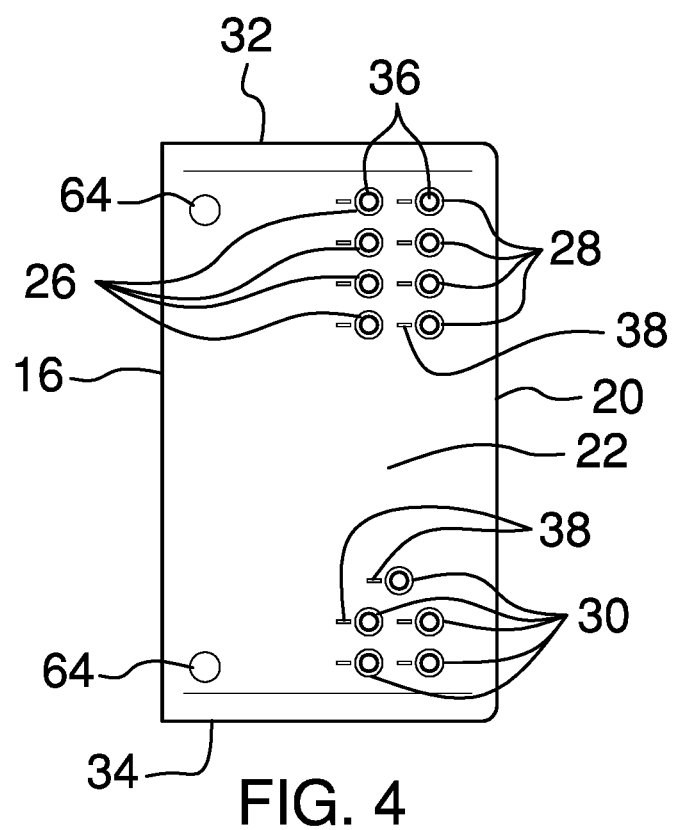
FIG. 4 is a side view of an embodiment of the disclosure.

With reference now to the drawings, and in particular to FIGS. 1 through 4 thereof, a new electrical junction box embodying the principles and concepts of an embodiment of the disclosure and generally designated by the reference numeral 10 will be described.

As best illustrated in FIGS. 1 through 4, the electrical junction box 10 generally comprises a housing 12 that defines an internal space 14. The housing 12 has a front 16, which is open. In one embodiment, the housing 12 is substantially rectangularly box shaped. In another embodiment, the housing 12 comprises metal. In yet another embodiment, the housing 12 comprises plastic.

A buss bar 18 is coupled to the housing 12 and is positioned in the internal space 14. In one embodiment, the buss bar 18 is coupled to a back 20 and a respective opposing side 22 of the housing 12.

A plurality of connectors 24 is coupled to the buss bar 18 and extends through the respective opposing side 22 of the housing 12. The connectors 24 are positioned through the respective opposing side 22 of the housing 12 such that the connectors 24 are configured to insert wires. The wires are coupled to the buss bar 18 and the buss bar 18 is coupled to an electrical circuit.

The plurality of connectors 24 comprises a plurality of first hots 26, a plurality of first neutrals 28 and a plurality of first grounds 30. In one embodiment, the plurality of first hots 26 extends linearly from proximate to a top of the housing 12 toward a bottom 34 of the housing 12. In another embodiment, the plurality of first hots 26 comprises four first hots 26. Each first neutral 28 is positioned adjacent to an associated first hot 26 such that each first neutral 28 and the associated first hot 26 comprise a connection 36. The first grounds 30 are positioned proximate to the bottom 34 of the housing 12. In one embodiment, the plurality of first grounds 30 comprises five first grounds 30. A respective connection 36 is positioned through the respective opposing side 22 of the housing 12 such that the connection 36 is configured for insertion of the wires. The wires are coupled to the buss bar 18 and the buss bar 18 is coupled to the electrical circuit. Respective connections 36 are positioned for coupling the buss bar 18 to additional components of the circuit.

Each of a plurality of first release slots 38 is coupled to the buss bar 18 proximate to an associated connector 36. The first release slot 38 is positioned on the buss bar 18 such that the first release slot 38 is configured to insert a tool, such as a standard screw driver, to decouple the wire from the associated connector 36.

A plurality of couplers 40 is coupled to the buss bar 18. The couplers 40 are positioned on a front face 42 of the buss bar 18. The couplers 40 are positioned on the buss bar 18 such that the couplers 40 are configured to insert wiring that is coupled to an electrical device, such as a switch, light, fan or outlet. The wiring is coupled to the buss bar 18 and the electrical device is coupled to the electrical circuit. In one embodiment, the plurality of couplers 40 comprises a second neutral 44, a second hot 46 and a second ground 48.

Each of a plurality of second release slots 50 is coupled to the buss bar 18 proximate to an associated coupler 40. The second release slot 50 is positioned on the buss bar 18 such that the second release slot 50 is configured to insert a tool, such as a standard screw driver, to decouple the wiring from the associated coupler 40.

A first tab 52 is coupled to and extends from a respective opposing side 22 of the housing 12 adjacent to the front 16. A plurality of holes 54 is positioned through the first tab 52. The holes 54 are configured for insertion of mounting hardware, such as screws and nails, to couple the housing 12 to a framing member. In one embodiment, the plurality of holes 54 comprises two holes 54.

A second tab 56 is coupled to and extends from the top 32 of the housing 12 adjacent to the front 16. The second tab 56 extends toward the bottom 34 of the housing 12. A third tab 58 is coupled to and extends from the bottom 34 of the housing 12 adjacent to the front 16. The third tab 58 extends toward the top 32 of the housing 12. Each of a pair of penetrations 60 is positioned singly through the second tab 56 and the third tab 58. The penetrations 60 are configured for insertion of mounting hardware, such as screws, to couple a cover plate to the housing 12.

In use, the connectors 24 are configured for insertion of wires, such that the wires are coupled to the buss bar 18 and the buss bar 18 is coupled to an electrical circuit. The couplers 40 are configured for insertion of wiring that is coupled to an electrical device, such as a switch, light, fan or outlet. The wiring is coupled to the buss bar 18 and the electrical device is coupled to the electrical circuit.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure. In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be only one of the elements.

I claim:

1. An electrical junction box comprising:
    a housing defining an internal space, said housing having a front, said front being open;
    a buss bar coupled to said housing and positioned in said internal space;
    a plurality of connectors coupled to said buss bar and extending through a respective opposing side of said housing;
    a plurality of couplers coupled to said buss bar, said couplers being positioned on a front face of said buss bar; and
    wherein said connectors are positioned through said respective said opposing side of said housing such that said connectors are configured for insertion of wires, such that the wires are coupled to said buss bar and said buss bar is coupled to an electrical circuit, wherein said couplers are positioned on said buss bar such that said couplers are configured for insertion of wiring coupled to an electrical device, such as a switch, light, fan or outlet, such that the wiring is coupled to said buss bar and the electrical device is coupled to the electrical circuit; and
    said plurality of connectors comprising
        a plurality of first hots,
        a plurality of first neutrals, each said first neutral being positioned adjacent to and laterally aligned with an associated said first hot on a common face of said housing such that each said first neutral and said associated said first hot comprise a connection on said common face of said housing,
        a plurality of first grounds, said first grounds being positioned proximate to a bottom of said housing, and
        wherein a respective said connection is positioned through said respective opposing side of said housing such that said connection is configured for insertion of the wires, such that the wires are coupled to said buss bar and said buss bar is coupled to the electrical circuit, and wherein respective said connections are positioned for coupling said buss bar to additional components of the circuit.

2. The junction box of claim 1, further including said housing being substantially rectangularly box shaped.

3. The junction box of claim 1, further including said housing comprising metal.

4. The junction box of claim 1, further including said housing comprising plastic.

5. The junction box of claim 1, further including said buss bar being coupled to a back and said respective opposing side of said housing.

6. The junction box of claim 1, further including said plurality of first hots extending linearly from proximate to a top of said housing toward said bottom of said housing.

7. The junction box of claim 1, further including said plurality of first hots comprising four said first hots.

8. The junction box of claim 1, further including said plurality of first grounds comprising five said first grounds.

9. The junction box of claim 1, further including a plurality of first release slots, each said first release slot being coupled to said buss bar proximate to an associated said connector, wherein said first release slot is positioned on said buss bar such that said first release slot is configured for insertion of a tool, such as a standard screw driver, to decouple the wire from said associated said connector.

10. The junction box of claim 1, further including said plurality of couplers comprising: a second neutral, a second hot and a second ground.

11. The junction box of claim 1, further including a plurality of second release slots, each said second release slot being coupled to said buss bar proximate to an associated said coupler, wherein said second release slot is positioned on said buss bar such that said second release slot is configured for insertion of a tool, such as a standard screw driver, to decouple the wiring from said associated said coupler.

12. The junction box of claim 1, further comprising:
   a first tab coupled to and extending from a respective opposing side of said housing adjacent to said front;
   a plurality of holes positioned through said first tab; and
   wherein said holes are positioned through said first tab such that said holes are configured for insertion of mounting hardware, such as screws and nails, to couple said housing to a framing member.

13. The junction box of claim 12, further including said plurality of holes comprising two said holes.

14. The junction box of claim 1, further comprising:
   a second tab coupled to and extending from a top of said housing adjacent to said front, said second tab extending toward a bottom of said housing;
   a third tab coupled to and extending from said bottom of said housing adjacent to said front, said third tab extending toward said top of said housing;
   a pair of penetrations positioned singly through said second tab and said third tab; and
   wherein said penetrations are positioned through said second tab and said third tab such that said penetrations are configured for insertion of mounting hardware, such as screws, to couple a cover plate to said housing.

15. The junction box of claim 1, further including a pair of tubes coupled to said housing and positioned in said internal space, said tubes being coupled singly to a top and a bottom of said housing proximate to said front, said tubes extending between said opposing sides of said housing, such that each said tube defines a channel through said housing, wherein said tubes are positioned in said internal space such that said tubes are configured for insertion of mounting hardware, such as screws and nails, through said channel to couple said housing to a framing member.

16. An electrical junction box comprising:
   a housing defining an internal space, said housing having a front, said front being open, said housing being substantially rectangularly box shaped, said housing comprising metal, said housing comprising plastic;
   a buss bar coupled to said housing and positioned in said internal space, said buss bar being coupled to a back and a respective opposing side of said housing,
   a plurality of connectors coupled to said buss bar and extending through said respective opposing side of said housing, wherein said connectors are positioned through said respective opposing side of said housing such that said connectors are configured for insertion of wires, such that the wires are coupled to said buss bar and said buss bar is coupled to an electrical circuit, said plurality of connectors comprising:
      a plurality of first hots, said plurality of first hots extending linearly from proximate to a top of said housing toward a bottom of said housing, said plurality of first hots comprising four said first hots,
      a plurality of first neutrals, each said first neutral being positioned adjacent to and laterally aligned with an associated said first hot on a common face of said housing such that each said first neutral and said associated said first hot comprise a connection on said common face of said housing,
      a plurality of first grounds, said first grounds being positioned proximate to said bottom of said housing, said plurality of first grounds comprising five said first grounds, and
      wherein a respective said connection is positioned through said respective opposing side of said housing such that said connection is configured for insertion of the wires, such that the wires are coupled to said buss bar and said buss bar is coupled to the electrical circuit, and wherein respective said connections are positioned for coupling said buss bar to additional components of the circuit;
   a plurality of first release slots, each said first release slot being coupled to said buss bar proximate to an associated said connector, wherein said first release slot is positioned on said buss bar such that said first release slot is configured for insertion of a tool, such as a standard screw driver, to decouple the wire from said associated said connector;
   a plurality of couplers coupled to said buss bar, said couplers being positioned on a front face of said buss bar, wherein said couplers are positioned on said buss bar such that said couplers are configured for insertion of wiring coupled to an electrical device, such as a switch, light, fan or outlet, such that the wiring is coupled to said buss bar and the electrical device is coupled to the electrical circuit, said plurality of couplers comprising: a second neutral, a second hot and a second ground;
   a plurality of second release slots, each said second release slot being coupled to said buss bar proximate to an associated said coupler, wherein said second release slot is positioned on said buss bar such that said second release slot is configured for insertion of a tool, such as a standard screw driver, to decouple the wiring from said associated said coupler;
   a first tab coupled to and extending from a respective opposing side of said housing adjacent to said front;
   a plurality of holes positioned through said first tab, wherein said holes are positioned through said first tab such that said holes are configured for insertion of mounting hardware, such as screws and nails, to couple said housing to a framing member, said plurality of holes comprising two said holes;
   a second tab coupled to and extending from said top of said housing adjacent to said front, said second tab extending toward said bottom of said housing;
   a third tab coupled to and extending from said bottom of said housing adjacent to said front, said third tab extending toward said top of said housing;
   a pair of penetrations positioned singly through said second tab and said third tab, wherein said penetrations are positioned through said second tab and said third tab such that said penetrations are configured for insertion of mounting hardware, such as screws, to couple a cover plate to said housing; and
   wherein said connectors are positioned through said housing such that said connectors are configured for insertion of wires, such that the wires are coupled to said buss bar and said buss bar is coupled to an electrical circuit, wherein said couplers are positioned on said buss bar such that said couplers are configured for insertion of wiring coupled to an electrical device, such as a switch, light, fan or outlet, such that the wiring is coupled to said buss bar and the electrical device is coupled to the electrical circuit.

* * * * *